(12) United States Patent
Chin et al.

(10) Patent No.: US 9,679,831 B2
(45) Date of Patent: Jun. 13, 2017

(54) TAPE CHIP ON LEAD USING PASTE DIE ATTACH MATERIAL

(71) Applicant: Cypress Semiconductor Corporation, San Jose, CA (US)

(72) Inventors: Lai Nguk Chin, Penang (MY); Paphat Phaoharuhan, Tung-Kru (TH); Sally Foong, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/970,872

(22) Filed: Dec. 16, 2015

(65) Prior Publication Data

US 2017/0047272 A1 Feb. 16, 2017

Related U.S. Application Data

(60) Provisional application No. 62/204,857, filed on Aug. 13, 2015.

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49513* (2013.01); *H01L 21/4825* (2013.01); *H01L 21/565* (2013.01); *H01L 23/3114* (2013.01); *H01L 23/4952* (2013.01)

(58) Field of Classification Search
CPC ........... H01L 23/49513; H01L 21/4825; H01L 21/565; H01L 23/3114
See application file for complete search history.

(56) References Cited

U.S. PATENT DOCUMENTS

| | | |
|---|---|---|
| 5,173,766 A | 12/1992 | Long et al. |
| 6,081,023 A | 6/2000 | Murakami et al. |
| 6,239,366 B1 | 5/2001 | Hsuan et al. |
| 6,635,138 B1 | 10/2003 | Choi |
| 7,880,313 B2 * | 2/2011 | Lee .......................... H01L 23/16 257/666 |
| 8,129,222 B2 | 3/2012 | Tan et al. |
| 8,324,729 B2 | 12/2012 | Gupta et al. |
| 8,361,899 B2 * | 1/2013 | Jiang ..................... H01L 21/563 438/123 |
| 8,642,395 B2 | 2/2014 | Li et al. |
| 8,647,966 B2 | 2/2014 | Lim et al. |
| 8,970,019 B2 | 3/2015 | Ozawa |

(Continued)

OTHER PUBLICATIONS

"Reliability in Electronic Packaging," 6 pages. https://cuvillier.de/uploads/preview/public_file/1519/9783869554334.pdf.

(Continued)

*Primary Examiner* — Caleb Henry

(57) ABSTRACT

According to various embodiments, systems and methods for packaging a semiconductor device are provided. The disclosure discusses a semiconductor die having a top side and a bottom side that is disposed on a lead frame. An adhesive paste is then applied to attach the semiconductor die to the lead frame such that the adhesive paste fixes the die to a portion of the lead frame. The adhesive paste may be applied directly between die and the lead frame or may be applied in conjunction with a frame tape.

8 Claims, 6 Drawing Sheets

(56) References Cited

U.S. PATENT DOCUMENTS

| | | | |
|---|---|---|---|
| 9,070,671 B2* | 6/2015 | Jiang | H01L 21/563 |
| 2008/0054422 A1* | 3/2008 | Koike | H01L 21/565 |
| | | | 257/676 |
| 2008/0224285 A1* | 9/2008 | Lim | H01L 23/4334 |
| | | | 257/675 |
| 2009/0026594 A1* | 1/2009 | Yee | H01L 21/4821 |
| | | | 257/676 |
| 2009/0087953 A1 | 4/2009 | Lin | |
| 2011/0151626 A1* | 6/2011 | Lin | H01L 33/486 |
| | | | 438/118 |
| 2011/0159284 A1 | 6/2011 | Choi et al. | |
| 2011/0163345 A1* | 7/2011 | Fukunaga | H01L 21/565 |
| | | | 257/98 |
| 2011/0169033 A1* | 7/2011 | Fukunaga | C07D 249/12 |
| | | | 257/98 |
| 2011/0227122 A1* | 9/2011 | Lin | H01L 21/486 |
| | | | 257/99 |
| 2011/0244629 A1* | 10/2011 | Gong | H01L 21/4828 |
| | | | 438/112 |
| 2011/0278638 A1* | 11/2011 | Lin | H01L 21/486 |
| | | | 257/99 |
| 2011/0298116 A1* | 12/2011 | Mizusaki | H01L 21/561 |
| | | | 257/676 |
| 2012/0153447 A1* | 6/2012 | Jiang | H01L 21/563 |
| | | | 257/673 |
| 2013/0320527 A1* | 12/2013 | Sunaga | H01L 23/3114 |
| | | | 257/737 |
| 2015/0001698 A1* | 1/2015 | Jaurigue | H01L 24/96 |
| | | | 257/676 |
| 2015/0200162 A1* | 7/2015 | Constantino | H01L 23/66 |
| | | | 257/532 |
| 2016/0043019 A1* | 2/2016 | Huang | H01L 23/49513 |
| | | | 174/257 |

OTHER PUBLICATIONS

Carsem,"Micro Leadframe Package," dated Apr. 2002; 20 pages.
Krishnan, Padmanabhan, "Product Visualization, Realization and Reliability of Non-Hermetically Encapsulated Integrated Circuit Packages," dated Mar. 2014, 8 pages, vol. 9 No. 3, ARPN Journal of Engineering and Applied Sciences, India.
International Search Report for International Application No. PCT/US2016/044068 dated Oct. 18, 2016; 2 pages.
Written Opinion of the International Searching Authority for International Application No. PCT/US2016/044068 mailed Oct. 18, 2016; 4 pages.

* cited by examiner

TAPE CHIP ON LEAD USING PASTE DIE ATTACH MATERIAL

PRIORITY

This application claims the priority and benefit of U.S. Provisional Application No. 62/204,857, filed on Aug. 13, 2015, the entire contents of which is incorporated by reference herein.

BACKGROUND

Background

In the field of semiconductor packaging, die attach film (DAF) is sometimes used to attach a completed semiconductor die to a substrate or lead frame. While DAFs are easy to use and to apply, they can have certain drawbacks. For instance, DAFs are unable to withstand high wire bond temperatures and are further susceptible to delamination abnormalities between the DAF and lead frame interface layer, which can cause problems in the final product and/or additional production costs. Additionally, DAFs are, themselves, expensive and their use increases the cost of semiconductor production. Accordingly, improvements are needed that do not suffer from the same production quality and abnormalities or cost issues.

BRIEF DESCRIPTION OF THE DRAWINGS

The accompanying drawings are incorporated herein and form a part of the specification of the disclosure.

In the drawings, like reference numbers generally indicate identical or similar elements. Additionally, generally, the left-most digit(s) of a reference number identifies the drawing in which the reference number first appears.

DETAILED DESCRIPTION

Provided herein are systems, methods and/or combinations and sub-combinations thereof, for the production of semiconductor packages using adhesive paste to bind a semiconductor die to a lead frame.

Figure 1:
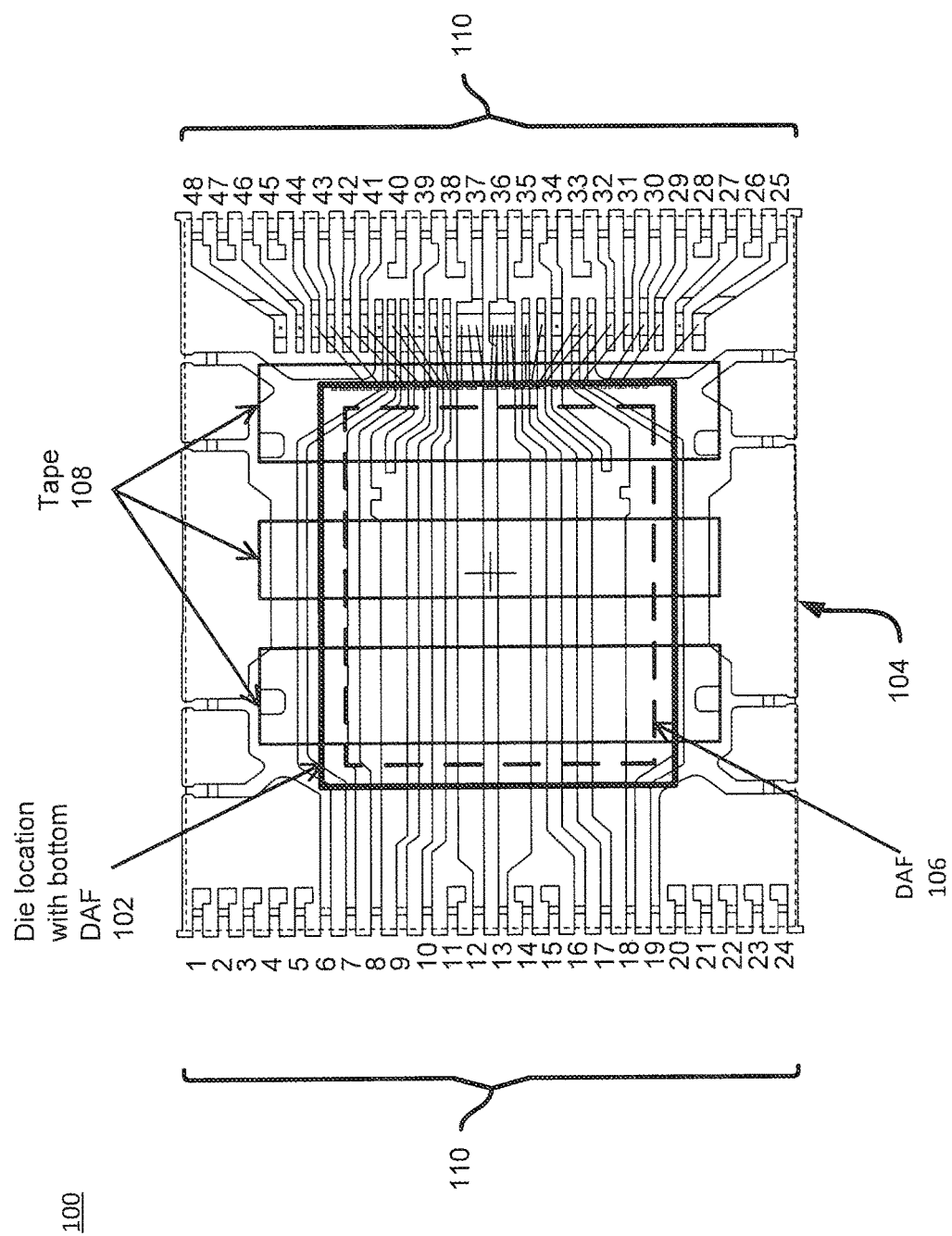
FIG. 1 is an example layout of a semiconductor package according to various embodiments of the disclosure.

FIG. 1 is a schematic depicting a semiconductor package 100 according to various embodiments of the disclosure. The semiconductor package 100 includes a semiconductor die 102 that is attached to a lead frame 104 with die attach film (DAF) 106 and a frame tape 108. The lead frame 104 can be used to connect package leads 110 to the appropriate conductors of the semiconductor die 102. According to various embodiments, the DAF 106 can be pre-applied during, for instance, an upstream wafer level lamination process. FIG. 1 depicts the DAF 106 as smaller than the die 102. This to aid in explanation of the figure. In practice DAF 106 may cover the entire die 102; the edges of DAF 106 can be co-extensive with the die 102. While FIG. 1 is depicted with a total of 48 lead pins 110, it should be understood that this is merely for explanation purposes and that any number or pattern, or shape of lead pins could be used and still fall within the scope and spirit of this disclosure.

The DAF 106 shown in FIG. 1 may be comprised of an adhesive layer that is disposed onto the wafer bottom (i.e., backside) during a pre-lamination process. The pre-lamination process, according to some embodiments, could occur before a wafer saw process. The DAF may comprise an adhesive of resin that is disposed on a film such as polyvinyl film, polyolefin film, or polyethylene terephthalate (PET) film. In FIG. 1, the DAF is used to attach the die 102 to a pad of a lead frame 104. In this way, the DAF 106 can be used to form a chip on lead (COL) package 100.

Figure 2:
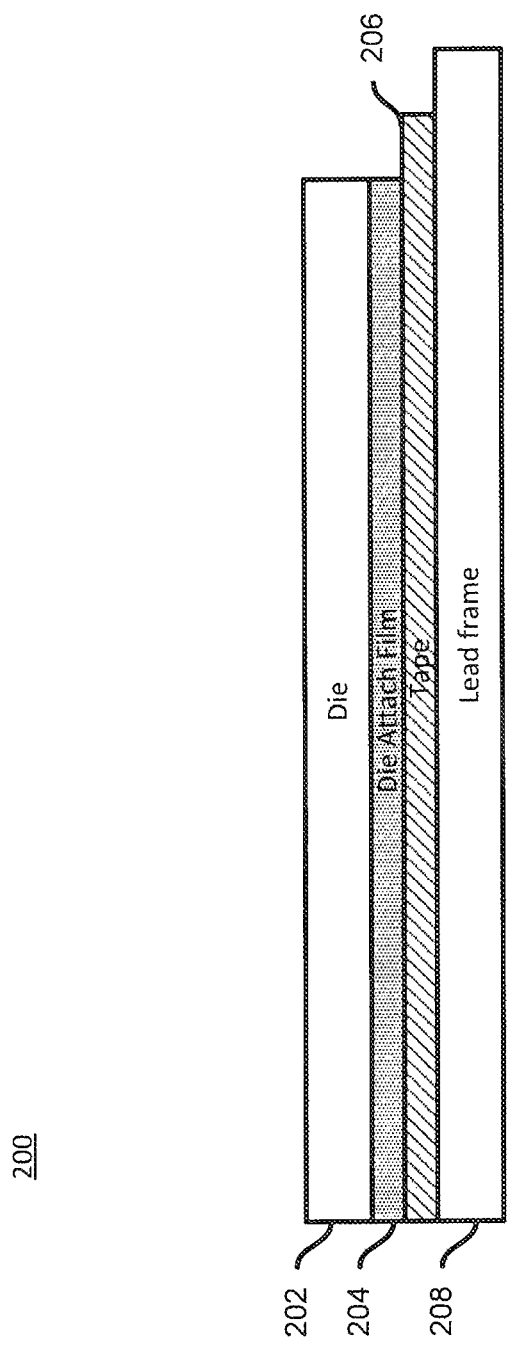
FIG. 2 is an example cross-sectional view of a semiconductor package according to various embodiments of the disclosure.

FIG. 2 is a cross sectional view of aspects of a semiconductor package 200. For instance, FIG. 2 could depict a cross-sectional view of semiconductor package 100 from FIG. 1 along the axis of one of the lengths of tape 108 according to various embodiments. As shown in FIG. 2, the semiconductor package 200 comprises a die 202 and a lead frame 208. The die 202 may be a semiconductor die containing a number of logic gates and/or analog semiconductor devices.

As shown in FIG. 2, the die 202 is attached to the lead frame 208 with a DAF 204 that is attached to bottom side of the die 202 and to a tape layer 206. According to various embodiments, the tape layer 206 may be similar to the frame tape 108 layer described above with respect to FIG. 1. The DAF 204 may comprise an adhesive of resin and disposed on a film such as polyvinyl film, polyolefin film, or polyethylene terephthalate (PET) film.

While effective in some respects, the use of die attach films such as DAF 204 can be problematic during semiconductor packaging processes. For instance, in some manufacturing processes, it can be desirable to use a high-temperature wire bond temperature. However, many DAFs have a maximum temperature that is less than the required wire bond temperature. Additionally, DAFs can suffer from delamination during the manufacturing process even when high-temperature methods are not used. Delamination occurs when outgassing occurs during the manufacturing process that causes separation between, for instance, DAF 204 and tape 206. This is problematic for the integrity of the bond between the die 202 and the lead frame 208. Additionally, problems can occur during wafer sawing. During wafer sawing, both layers of the laminated die (e.g., die 202), which is brittle and hard material such as silicon, and layers of DAF, which is soft elastic, must be sawed through. This can result in DAF (e.g., DAF 204) burrs. DAF burrs are remnants or whiskers of DAF adhesive at the bottom and sides of sawn die edges. These adhesive DAF burrs results in various process and multiple quality issues and challenges. For instance, the burrs can cause adjacent dies to "stick" together which can result an adjacent die being picked along with a target die during the production process. This problem can be especially prevalent when dealing with very small die (e.g., less than 2 mm) that have small (e.g., 60 μm and smaller) narrow saw streets between rows and columns of die in sawn wafer. This problem can also result in die cracks, broken die, or chipping die—especially for thin and large (e.g., greater than 8 mm) die. All of these problems result in increased production cost. A better method would be to replace the DAF 204 with a material that is not subject to the same disadvantages from which DAF 204 materials suffer.

Figure 3:
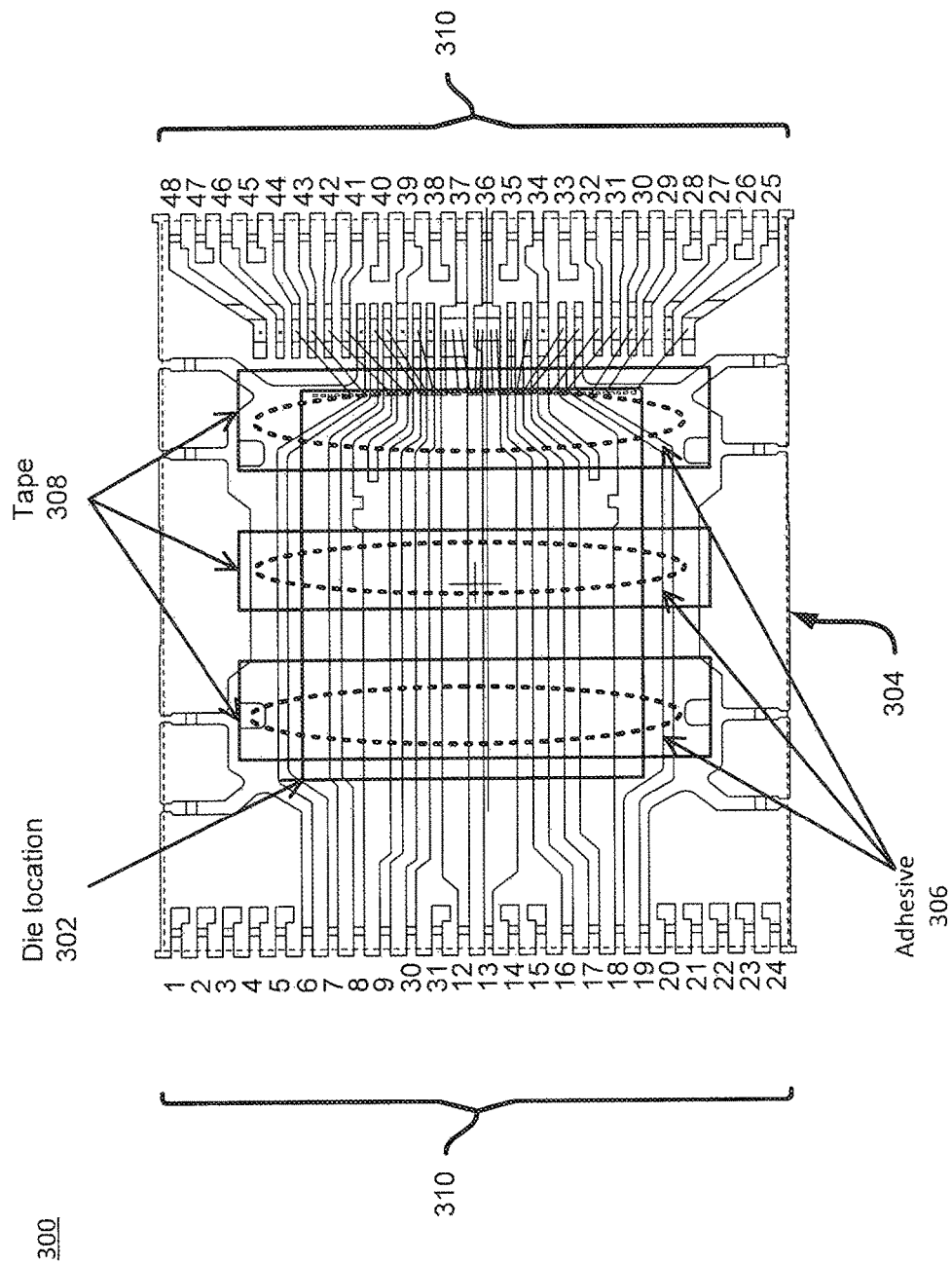
FIG. 3 is an example layout of a semiconductor package according to various embodiments of the disclosure.

FIG. 3 is a schematic depicting a semiconductor package 300 according to various embodiments of the disclosure. The semiconductor package 300 includes a semiconductor die 302 that is attached to a lead frame 304 with adhesive paste 306 and a frame tape 308. The lead frame 304 may comprise any suitable lead frame for the die 302 or a no-lead package such as a dual-flat no-lead (DFN) package or quad-flat no-lead (QFN) package according to various embodiments.

In some embodiments, the amount of adhesive paste 306 used to connect the die 302 with the tape 308 is controlled so that it provides maximum coverage of the frame tape 308 without overflowing the edges of the frame tape 308. In other embodiments the amount of adhesive paste 306 used is simply determined so that it will not overflow the frame tape 308. The frame tape 308 may also be used to create a die attach paddle for joining the die 302 to the lead frame 304 in some embodiments.

While FIG. 3 depicts a package 300 with three lengths of frame tape 308, this is simply to illustrate that multiple lengths or shapes of frame tape 308 may be used. According to other embodiments, more or fewer lengths or shapes of frame tape 308 could be used. For instance, in some embodiments, only a single length and shape of frame tape 308 is employed. This is discussed in greater detail, below, with respect to FIG. 5.

The lead frame 304 can be used to connect package leads 310 to the appropriate conductors of the semiconductor die 302. While FIG. 3 is depicted with a total of 48 lead pins 310, it should be understood that this is merely for explanation purposes and that any number or pattern or shape of lead pins could be used and still fall within the scope and spirit of this disclosure.

The adhesive paste 306 shown in FIG. 3 may comprise any appropriate adhesive paste or liquid adhesive material. For instance, according to some embodiments, the adhesive paste 306 comprises an adhesive of paste that is either electrically insulating or electrically or thermally conducting depending on the specific application. For instance, an entirely polymer-based adhesive paste can be used if an electrically insulating adhesive 306 is desired. Similarly, a thermal or thermally conducting adhesive paste can be used when a thermally or an electrically conducting adhesive paste 306 is desired. In FIG. 3, the adhesive paste 306 used to attach the die 302 to a pad of a lead frame 304 In this way, the adhesive paste can be used to form a chip on lead (COL) package 300.

Figure 4:
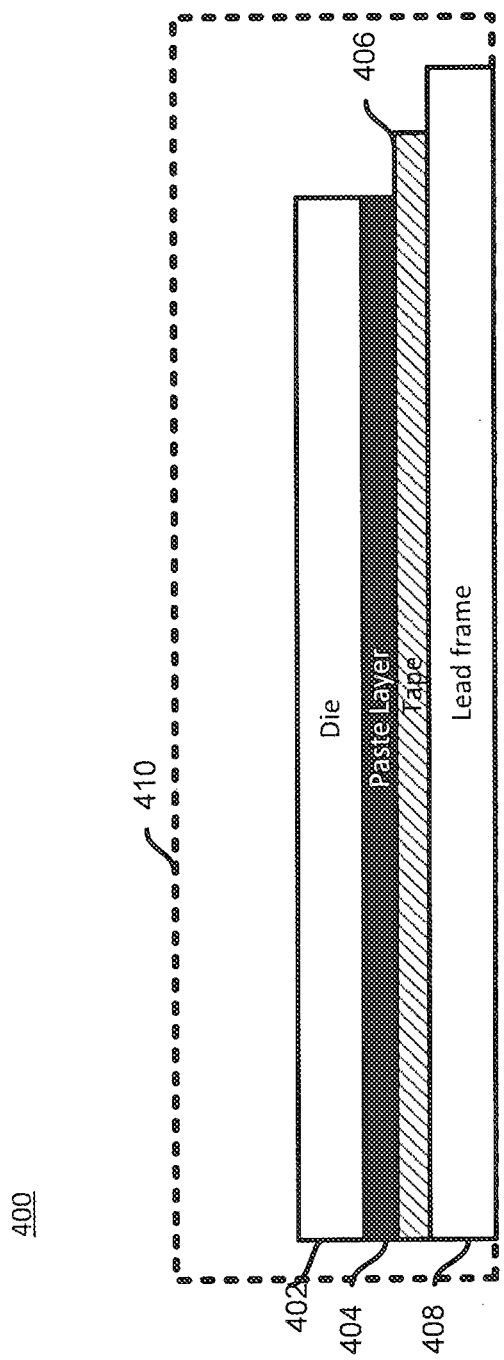
FIG. 4 is an example cross-sectional view of a semiconductor package according to various embodiments of the disclosure.

FIG. 4 is a cross sectional view of aspects of a semiconductor package 400. For instance, FIG. 4 could depict semiconductor package 300 from FIG. 3 with the cross section along a length of tape 308. As shown in FIG. 4, the semiconductor package 400 comprises a die 402 and a lead frame 408. The die 402 may be a semiconductor die containing a number of logic gates and/or analog semiconductor devices. Lead frame 408 may comprise any suitable semiconductor packaging substrate such as a lead frame pad or the like.

As shown in FIG. 4, the die 402 is attached to the lead frame 408 with an adhesive paste 404 that is attached to one side of the die 402 and to a tape layer 406. According to various embodiments, the tape layer 406 may be similar to the frame tape 308 layer described above with respect to FIG. 3. The adhesive paste 404 may comprise an adhesive of resin and disposed On a film such as polyvinyl film, polyolefin film, or polyethylene terephthalate (PET) film. An encapsulation or seal 410 may be applied to seal the semiconductor package comprising the die 402, the paste layer 404, the tape 406, and the lead frame 408.

Figure 5:
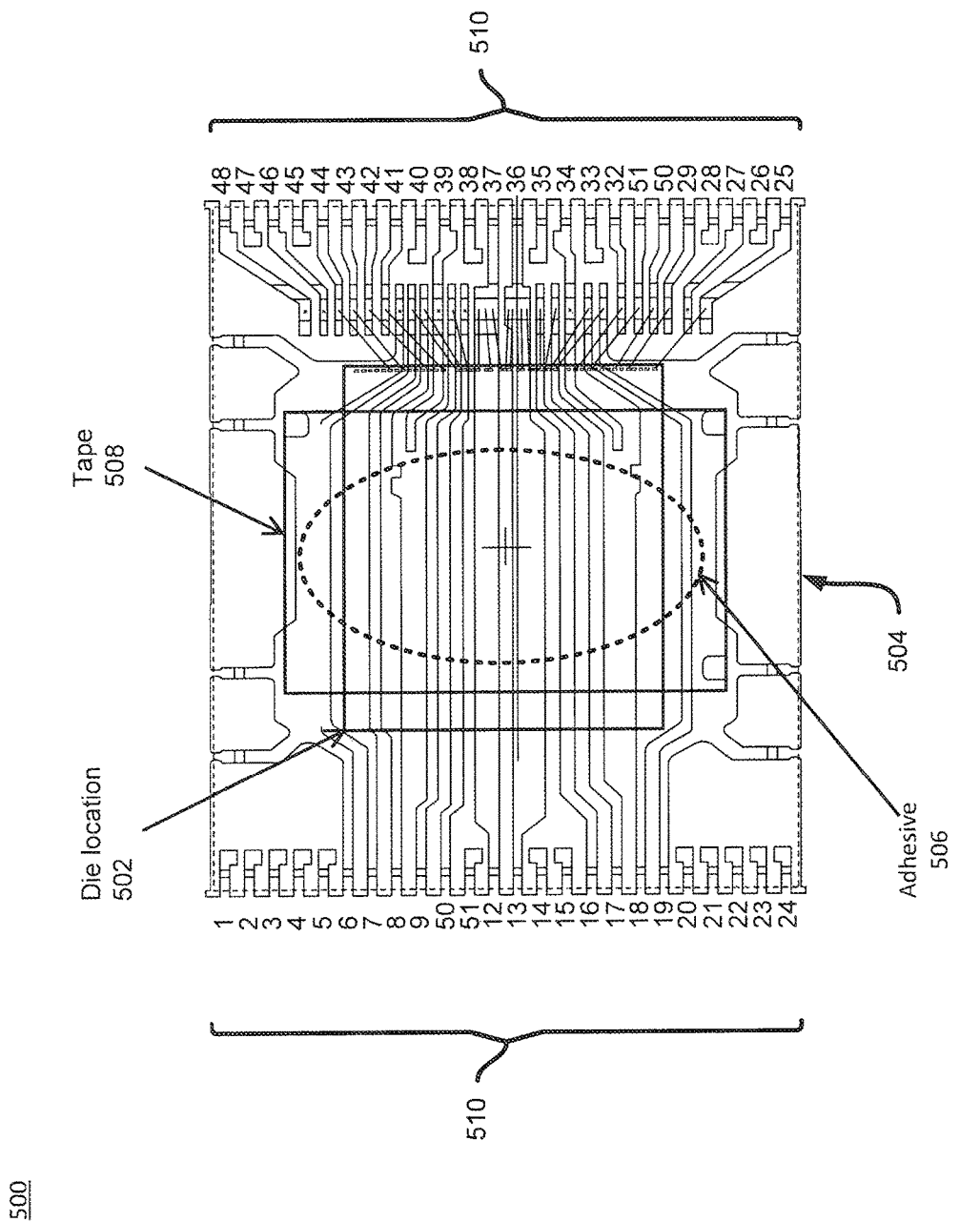
FIG. 5 is an example layout of a semiconductor package according to various embodiments of the disclosure.

While FIG. 3 describes depicts a package 300 with three lengths of frame tape 308, this is simply to illustrate that multiple lengths of frame tape 308 may be used. According to other embodiments, more or fewer lengths or shapes of frame tape 308 could be used. Indeed, entirely different lead frame shapes and sizes can be used in conjunction with the disclosed subject matter. FIG. 5 depicts one such alternative.

FIG. 5 is a schematic depicting a semiconductor package 500 according to various embodiments of the disclosure. The semiconductor package 500 includes a semiconductor die 502 that is attached to a lead frame 504 with adhesive paste 506 and a frame tape 508. In some embodiments, the amount of adhesive paste 506 used to connect the die 502 with the tape 508 is controlled so that it provides maximum coverage of the frame tape 508 without overflowing the edges of the frame tape 508. In other embodiments the amount of adhesive paste 506 used is simply determined so that it will not overflow the frame tape 308.

In contrast to FIG. 3, FIG. 5 depicts a package 500 with only a single length of frame tape 508. The lead frame 504 can be used to connect package leads 510 to the appropriate conductors of the semiconductor die 502. While FIG. 5 is depicted with a total of 48 lead pins 510, it should be understood that this is merely for explanation purposes and that any number or pattern or shape of lead pins could be used and still fall within the scope and spirit of this disclosure.

The adhesive paste 506 shown in FIG. 5 may comprise any appropriate adhesive paste material. For instance, according to some embodiments, the adhesive paste 506 comprises an adhesive of paste that is either electrically insulating or electrically or thermally conducting depending on the specific application. For instance, an entirely polymer-based adhesive paste can be used if an electrically insulating adhesive 506 is desired. Similarly, a thermal or thermally conducting adhesive paste can be used when a thermally or an electrically conducting adhesive paste 506 is desired. In FIG. 5, the adhesive paste 506 used to attach the die 502 to a pad of a lead frame 504 In this way, the adhesive paste can be used to form a COL package 500.

Figure 6:
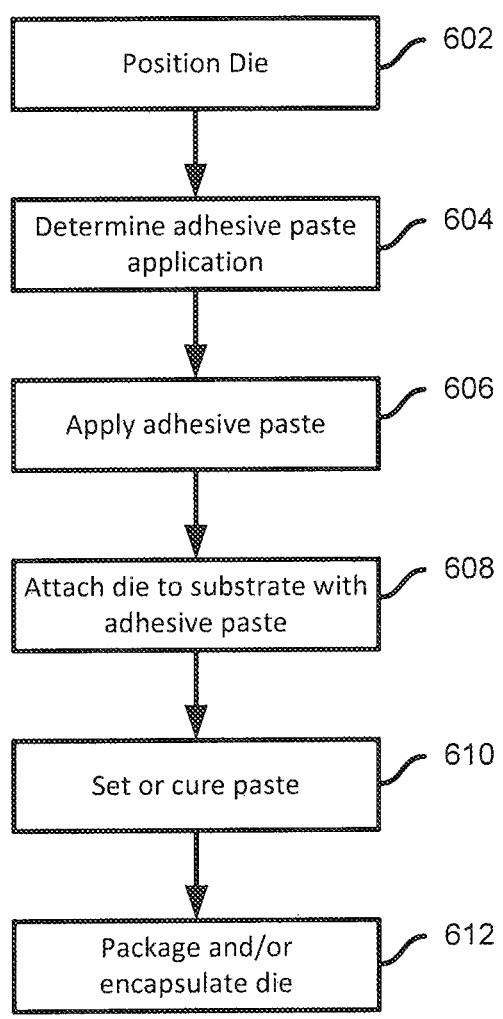
FIG. 6 is a flowchart illustrating a method of producing a semiconductor package according to various embodiments of the disclosure.

FIG. 6 is a flowchart depicting a method 600 of packaging a die (e.g., die 302) according to various embodiments of the disclosure. To aid explanation, method 600 will be described with reference to FIG. 3 as well, but it should be understand that method 600 is not limited to the specific embodiments depicted in FIG. 3. According to the method 600 a die 302 is positioned appropriately to enable it to have adhesive paste 306 applied to it at stage 602.

At stage 604, the appropriate amount of adhesive paste 306 to apply to the die 302 is determined. According to some embodiments, it may be desirable to vary the amount of adhesive paste 306 depending on various factors. For instance, the kind of adhesive paste 306 (e.g., polymer based or silver filled) may affect the amount and pattern (shape) of adhesive paste 306 that needs to be applied to the die 302. Similarly, the specific geometry of a die 302 could also affect the amount of adhesive paste 306 required. In some embodiments, the amount of adhesive paste 306 to apply to the die 302 may be determined as an amount that will provide maximum coverage without over flowing, for instance, the edges of frame tape 308.

At stage 606, the determined amount of adhesive paste 306 is applied to the die 302. According to some embodiments, the adhesive paste 306 could be applied at multiple locations on die 302. For instance, the adhesive paste 306 may be applied at the points on the die 302 where frame tape 308 is to be disposed. In such embodiments, the adhesive paste 306 may be applied such that it does not overflow the edges of tape 308. It is also possible, in some embodiments, that the adhesive paste 306 is only applied in a single location.

At stage 608, the die 302 is attached to the lead frame 304 using the adhesive paste 306. For instance, the die 302 could be attached to a lead frame pad In some embodiments attaching the die 302 to the lead frame 304 may include disposing a frame tape 308 between the adhesive paste 306 and the lead frame 304. At stage 610 the adhesive paste 306 is cured (by, e.g., applying a particular wavelength of light to the adhesive paste) as appropriate to the particular kind of adhesive paste being employed. At stage 612, the process of packaging die 302 can be completed according to suitable methods.

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps. operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A method of packaging a semiconductor device comprising:
   providing a semiconductor die having a top side and a bottom side;
   providing a lead frame disposed beneath the semiconductor die;
   disposing a tape layer between the semiconductor die and the lead frame, wherein the tape layer comprises a plurality of discontinuous tape strips;
   applying non-conductive a paste layer to a portion of the bottom side of the semiconductor die, wherein the paste layer is applied such that it covers a portion of the tape layer without overflowing the tape layer;
   positioning the semiconductor die on the lead frame using the paste layer; and
   curing the paste layer to join the semiconductor die to the lead frame.

2. The method of 1, wherein applying the paste layer comprises disposing the paste layer such that it is discontinuous and leaves portions of the semiconductor die uncovered by the paste layer.

3. The method of claim 1, further comprising:
   forming a die attach paddle using the tape layer disposed between the semiconductor die and the lead frame.

4. The method of claim 3, wherein the paste layer is disposed between the semiconductor die and the tape layer.

5. The method of claim 4, wherein the paste layer leaves at least part of the tape layer uncovered.

6. The method of claim 1, further comprising:
   disposing a pad between the semiconductor die and the lead frame.

7. The method of claim 6, wherein at least a portion of the paste layer is disposed between the semiconductor die and the pad.

8. The method of claim 1, wherein the paste layer is configured to withstand a wire bond temperature without delamination.

* * * * *